United States Patent [19]

Eivers et al.

[11] 4,300,207

[45] Nov. 10, 1981

[54] MULTIPLE MATRIX SWITCHING SYSTEM

[75] Inventors: Donald J. Eivers, Massapequa; Eddie J. Kovacs, Kings Park, both of N.Y.

[73] Assignee: Grumman Aerospace Corporation, Bethpage, N.Y.

[21] Appl. No.: 78,900

[22] Filed: Sep. 25, 1979

[51] Int. Cl.³ .............................................. G01R 31/28
[52] U.S. Cl. ................................ 364/900; 324/73 R; 371/20
[58] Field of Search ...................... 371/20, 24, 25, 26; 324/73 R, 73 AT, 73 PC; 364/200, 900

[56] References Cited

U.S. PATENT DOCUMENTS

| | | | |
|---|---|---|---|
| 2,950,437 | 8/1960 | Stahl | 324/73 R |
| 3,237,100 | 2/1966 | Chalfin et al. | 324/73 R |
| 3,246,240 | 4/1966 | Arnold et al. | 324/73 R |
| 3,764,995 | 10/1973 | Helf, Jr. et al. | 364/900 |
| 3,922,537 | 11/1975 | Jackson | 371/20 |
| 3,931,506 | 1/1976 | Borrelli et al. | 371/20 |
| 4,055,801 | 10/1977 | Pike et al. | 371/20 |
| 4,066,882 | 1/1978 | Esposito | 371/20 |
| 4,070,565 | 1/1978 | Borrelli | 371/20 |
| 4,142,243 | 2/1979 | Bishop et al. | 371/25 |
| 4,168,796 | 9/1979 | Fulks et al. | 371/20 |

OTHER PUBLICATIONS

Emilio, et al., New Automatic Test Equipment Emphasizes User Interface, Autotestcon, Nov. 1977, pp. 191-198.

Primary Examiner—Charles E. Atkinson
Attorney, Agent, or Firm—Morgan, Finnegan, Pine, Foley & Lee

[57] ABSTRACT

A multiple matrix switching system for use in connecting a unit under test to one or more external instruments which may either provide a signal input to the unit under test or measure the output of the unit under test is disclosed. Matrix switching allows connections between the unit under test and each external instrument to be effected with only two switching elements. Switching system control to select a signal path is accomplished by means of a microprocessor which resolves switching path conflicts through switching system status monitoring.

11 Claims, 11 Drawing Figures

UNIVERSAL PINS POSSIBLE AS A FUNCTION OF NUMBER OF BUSSES AND BUS ACCESSES PER PIN

MULTIPLE MATRIX SWITCH, DIP ROCKER SWITCH POSITIONS

DIP SWITCH CODES

| ASCII CODE CHARACTER | | ADDRESS SWITCHES | | | | | 5-BIT DECIMAL CODE |
|---|---|---|---|---|---|---|---|
| LISTEN | TALK | 5 | 4 | 3 | 2 | 1 | |
| SP | @ | 0 | 0 | 0 | 0 | 0 | 00 |
| ! | A | 0 | 0 | 0 | 0 | 1 | 01 |
| " | B | 0 | 0 | 0 | 1 | 0 | 02 |
| # | C | 0 | 0 | 0 | 1 | 1 | 03 |
| $ | D | 0 | 0 | 1 | 0 | 0 | 04 |
| % | E | 0 | 0 | 1 | 0 | 1 | 05 |
| & | F | 0 | 0 | 1 | 1 | 0 | 06 |
| ' | G | 0 | 0 | 1 | 1 | 1 | 07 |
| ( | H | 0 | 1 | 0 | 0 | 0 | 08 |
| ) | I | 0 | 1 | 0 | 0 | 1 | 09 |
| * | J | 0 | 1 | 0 | 1 | 0 | 10 |
| + | K | 0 | 1 | 0 | 1 | 1 | 11 |
| , | L | 0 | 1 | 1 | 0 | 0 | 12 |
| - | M | 0 | 1 | 1 | 0 | 1 | 13 |
| . | N | 0 | 1 | 1 | 1 | 0 | 14 |
| / | O | 0 | 1 | 1 | 1 | 1 | 15 |
| ∅ | P | 1 | 0 | 0 | 0 | 0 | 16 |
| 1 | Q | 1 | 0 | 0 | 0 | 1 | 17 |
| 2 | R | 1 | 0 | 0 | 1 | 0 | 18 |
| 3 | S | 1 | 0 | 0 | 1 | 1 | 19 |
| 4 | T | 1 | 0 | 1 | 0 | 0 | 20 |
| 5 | U | 1 | 0 | 1 | 0 | 1 | 21 |
| 6 | V | 1 | 0 | 1 | 1 | 0 | 22 |
| 7 | W | 1 | 0 | 1 | 1 | 1 | 23 |
| 8 | X | 1 | 1 | 0 | 0 | 0 | 24 |
| 9 | Y | 1 | 1 | 0 | 0 | 1 | 25 |
| : | Z | 1 | 1 | 0 | 1 | 0 | 26 |
| ; | [ | 1 | 1 | 0 | 1 | 1 | 27 |
| < | \ | 1 | 1 | 1 | 0 | 0 | 28 |
| = | ] | 1 | 1 | 1 | 0 | 1 | 29 |
| > | ~ | 1 | 1 | 1 | 1 | 0 | 30 |

NOTE: MMS USES TWO GPIB ADDRESSES.
FIRST ADDRESS IS THE SWITCH SETTING.
SECOND ADDRESS IS THE SWITCH SETTING + 2
MAXIMUM SWITCH SETTING IS 'BINARY 28'

MULTIPLE MATRIX SWITCHING SYSTEM

BACKGROUND OF THE INVENTION

This invention relates to the field of high performance switching systems, and more particularly to a "smart" multiple matrix switching system which permits implementation of universal pin concepts in conjunction with the utilization of automatic test equipment (ATE).

Typically, sophisticated ATE configured as an automatic test station finds wide application in the avionics instrumentation field. Examples of such ATE are found in the computerized automatic testers (CAT-series) sold by the assignee herein, Grumman Aerospace Corporation. Automatic testing of the various electronic systems and subsystems of an aircraft may be readily conducted by means of such automatic test equipment.

The test interface is that portion of the ATE where the unit under test (UUT) is connected. It is apparent that the tradeoff between interface versatility and simplicity of ATE hardware presents a somewhat difficult design problem. On the one hand, it is desirable to have a versatile interface that minimizes or eliminates the use of interface adapters. On the other hand, such an interface can be so complex it could reduce the reliability, in increase the cost, and degrade the frequency performance of the ATE system.

An optimal switching system for connecting a UUT would have several basic capabilities. First, the test interface should be reliable and maintainable. High-current hot switching should be segregated from signal switching to increase switching component life. Moreover, the hardware portion of the test interface should be simple with as few parts as possible; it must also have superior test and fault isolation characteristics.

Second, the test interface should possess certain performance characteristics, such as, for example, signal path repeatability. No matter how many times a program is recompiled, the signal paths should remain constant. It should provide signal fidelity and be capable of performing the interface function at fundamental switching frequencies up to 20 MHz along with low cross talk and insertion loss. It also should have functional flexibility for signal routing and switching.

Third, the test interface should be compatible with the software. It should work in a high level language environment, such as, for example, ATLAS, operate off the IEEE-488 interface bus and be easy to program. And finally, the test interface should be low in cost.

The current state-of-the-art for automatic test systems has addressed and solved many traditional ATE problems. The "electronics behind the pin" concept has given rise to the "universal pin" with all its inherent advantages including simplification of the system/UUT interface, flexibility, and minimization of programmer and operator involvement with the connection process. Simultaneously with the advent of the universal pin, improvements have been made in the ATE instrumentation field. These improvements have not been limited to instrument performance, but include the ability to easily integrate and merge these increased capabilities into an effective test system through the use of the IEEE-488 bus. Unfortunately, universal pin test systems can make little use of these enhanced instrument capabilities because the instrumentation is often provided by unique and custom designed electronics behind each universal pin.

It is believed that prior to the present invention, there has not been available a switching system that would take advantage of such state-of-the-art instrument capabilities in a universal pin system.

It is accordingly a general object of the present invention to provide a switching system which has characteristics more nearly approaching the optimal attributes described above, particularly those applicable to ATE applications.

It is a particular object of the invention to provide a multiple matrix switching system having a universal pin interface, i.e., all instrument capabilities available at each interface pin, between the UUT and a multiplicity of instruments.

Other objects will be apparent in the following detailed description and the practice of the invention.

SUMMARY OF THE INVENTION

The foregoing and other objects and advantages which will be apparent in the following detailed description of the preferred embodiment, or in the practice of the invention, are achieved by the invention disclosed herein, which generally may be characterized as a switching system for selectively connecting a unit under test to an external instrument comprising: test interface means for adapting said unit under test to said switching system; instrument interface means for adapting said instrument to said switching system; signal bus means; multiple matrix switching means for controllably providing a signal path between said test interface means and said instrument interface means via said signal bus means; control means for selectively activating said multiple matrix switching means to effect connection of said unit under test to said instrument; and means for effecting communication between an external controller and said control means.

BRIEF DESCRIPTION OF THE DRAWINGS

Serving to illustrate an exemplary embodiment of the invention are the drawings of which.

DESCRIPTION OF THE PREFERRED EMBODIMENT

To better understand and appreciate the present invention and its advantages, it is helpful to understand the generalized multiple matrix approach utilized in conjunction with an internal signal bus arrangement to implement the universal pin capability.

Figures 1A, 1B:
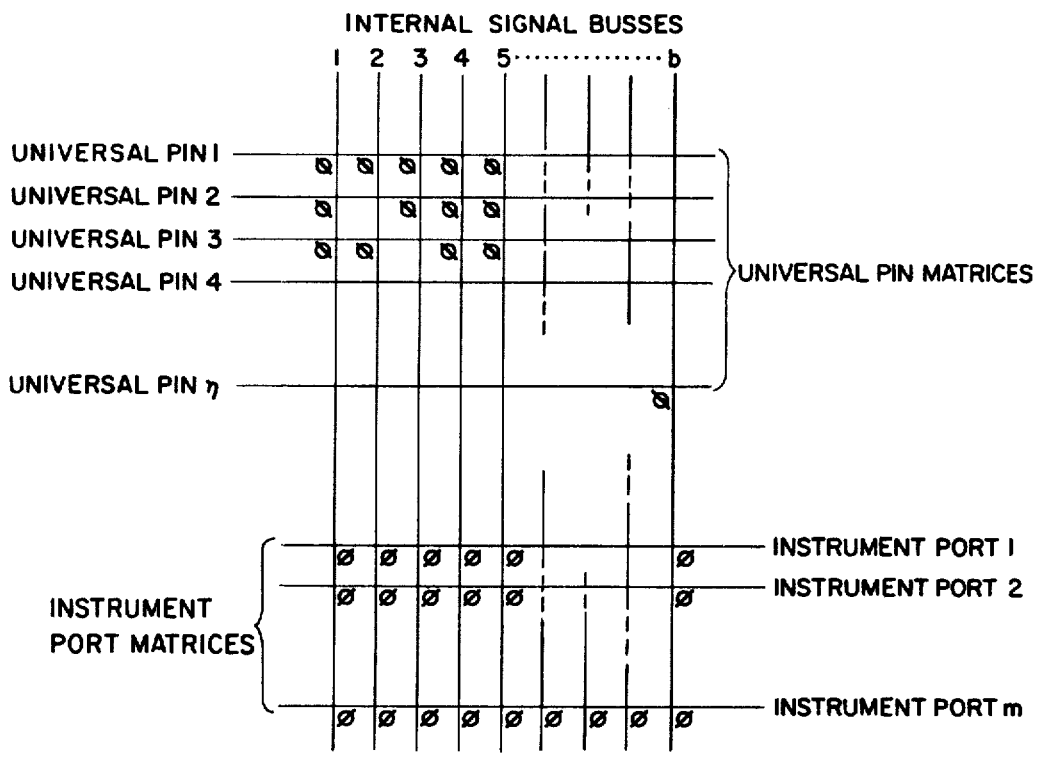
FIGS. 1a, 1b and 1c illustrate the multiple matrix approach to universal pin implementation.

Referring to FIG. 1a, a number of internal signal busses (b) are provided within the multiple matrix switch mainframe. Each universal pin has access to some subset (p) of the total number of internal busses. A single switching element provides access to each internal bus. Because of hardware commonality and control system considerations, each universal pin is provided with access to a unique combination of internal busses. Accordingly, the design considerations become a question of: (1) the number of internal signal busses to provide (which guarantees the number of simultaneous unique signal paths that may be established at any given time; (2) the number of bus access relays to provide for each universal pin (which guarantees the number of simultaneous paths that may be established using only random signal bus selection techniques); and (3) the total number of universal pins to be provided.

In practice it has been found that 100 universal pins are sufficient to meet the interface test requirements of a majority of the modules to be tested. Thus, conveniently selecting a design goal of approximately 100 universal pins, the number of universal pins (U) that can be provided by the multiple matrix configuration illustrated in FIG. 1a may be calculated using the number of internal signal busses (b) and the number of accesses provided per universal pin (p) as variables by the following relationship:

$$U = \frac{b!}{p! \cdot (b - p)!}$$

Figure 1C:
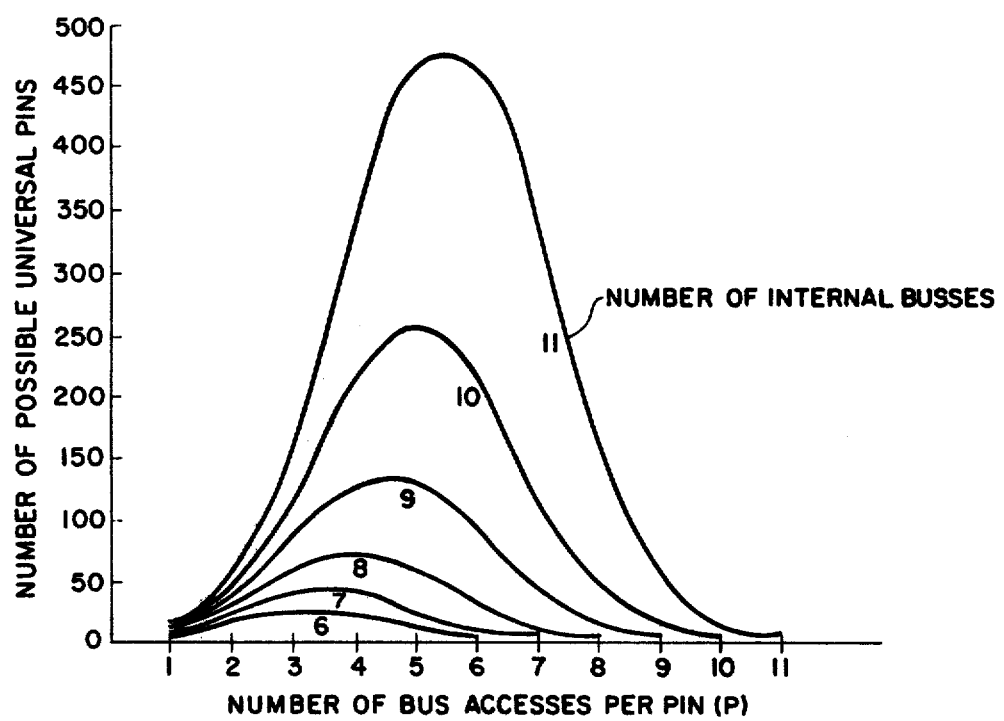

A tabulation and a plot of the results are given in FIGS. 1b and 1c, respectively. Since the required number of universal pins was selected as approximately 100, the outlined area in FIG. 1b indicates the combinations of internal signal busses/signal bus accesses per universal pin that meet or slightly exceed this goal.

Based on the above, a system was selected which provides 10 internal signal busses, and 5 bus accesses per universal pin. This allows considerable growth capability above the design goal of 100 universal pins.

The selection of the particular switching devices to be used is based upon the user's requirements. Solid state switching devices (FET switches, multiplexers, etc.) are desirable because of their high reliability. However, if the need for switching high and low level signals to high frequencies such as, for example, 20 MHz, is considered, only standard mechanical relays can meet the requirements.

To further minimize signal distortion all signal paths internal to the multiple matrix switch preferably should be formed of closely matched 50 ohm lines (coaxial or transmission lines).

Figure 2:
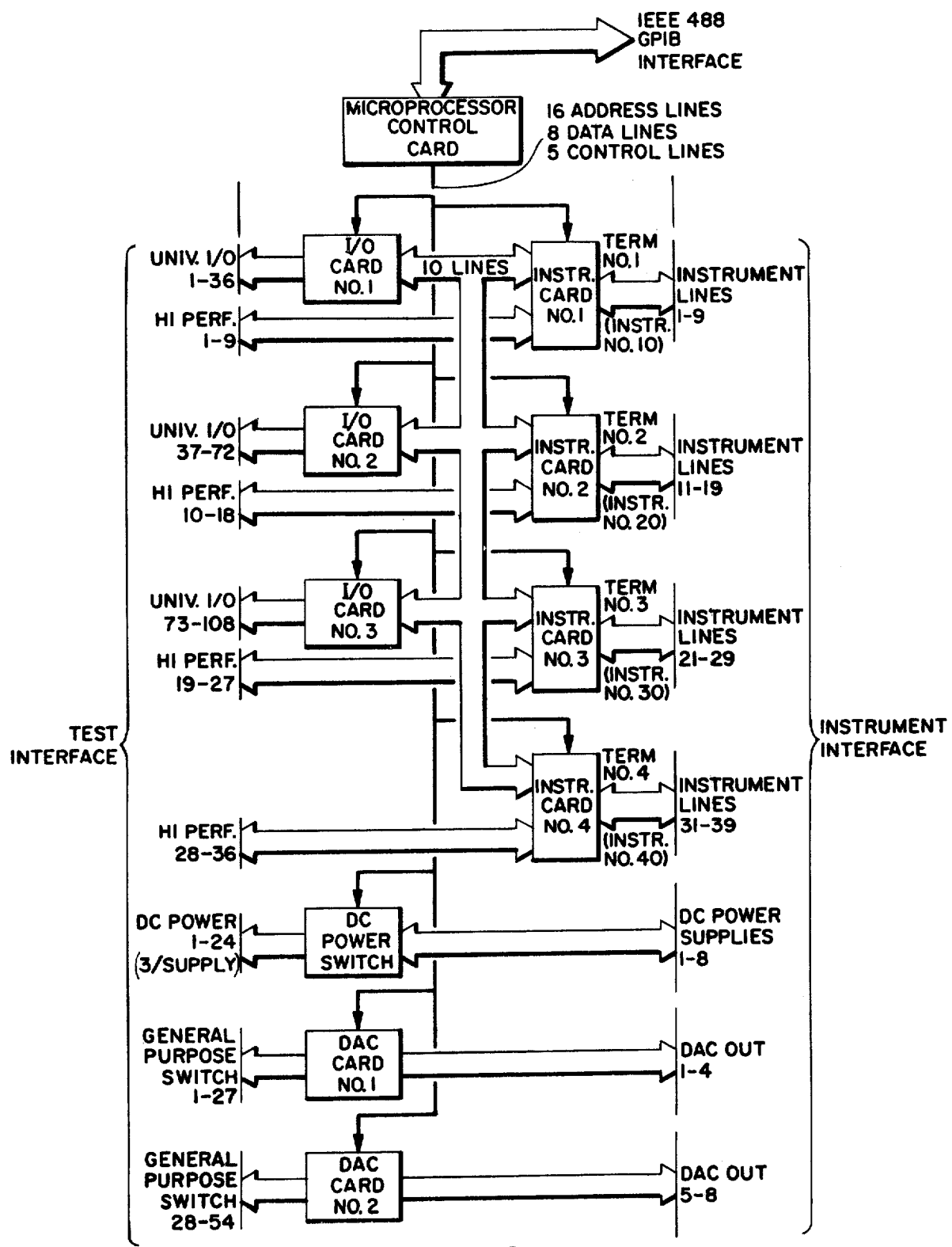
FIG. 2 is a block diagram of the multiple matrix switching system, in accordance with the present invention.

A block diagram of the universal switching system embodying the multiple matrix concept discussed above is illustrated in FIG. 2. As shown therein, the universal switching system consists of a number of functional subsystems including a Microprocessor Control subsystem, an I/O Relay subsystem, an Instrument Relay subsystem, a DAC Relay subsystem and a DC Power Switch subsystem. A host computer (not shown) which is part of an automatic test station is interfaced with the switching system by means of the industry IEEE-488 GPIB data communication bus.

As configured, the Microprocessor Control subsystem consists of one card, the I/O Relay subsystem consists of three cards, the Instrument Relay subsystem consists of four cards, the DAC Relay subsystem consists of two cards and the DC Power Switch subsystem consists of one card. However, it is noted that a minimum configuration multiple matrix switching system would contain one Microprocessor Control card, one I/O Relay card and one Instrument Relay card.

The multiple matrix switching system is a microprocessor controlled switching and interface system which utilizes an IEEE-488 GPIB to interface with the host computer. The multiple matrix switching system performs switching and routing for all analog signals/functions available at the test interface, which includes power, stimuli and response lines.

Multiple, programmable, DC reference voltages, programmed loads, and terminations are also provided. Selection and generation of these reference voltages and loads are under the control of the Microprocessor Control subsystem.

Signal selection and routing within the multiple matrix switching system is accomplished through the use of ten line signal buses. Signals are routed from the test interface connector to an Input/Output (I/O) Relay card. From there, they are sent through the card by means of an I/O Relay Select matrix to the signal bus, and on to the Instrument Relay card. Signals are then passed through an Instrument Select Relay matrix to the Instrument Relay card, and by cable to the selected instrument. Connections to the cards are made through multiple coax cables. In the basic configuration illustrated, the input coax cables to the I/O Relay card are connected to a front panel mounted patchboard (not shown).

The Microprocessor Control subsystem consists of a self-contained computer. It is used for selection, switching and routing of all signals and functions within the multiple matrix switching system. The Microprocessor Control subsystem determines signal path selection, while continually monitoring and updating status of all signal paths. Conflict checks are made on all path connection commands. Repeatability of path selection is maintained at all times.

The Microprocessor Control subsystem accepts commands from the host computer through the IEEE-488 GPIB interface. It interprets these commands and performs the necessary action. It receives the following ASCII code character strings, and after determining that it is a valid instruction, performs the indicated operation.

a. CS xxx $ -
   Closes general purpose relay number
   'xxx' where 'xxx' = 001 to 027. If
   pin is already connected, sends
   'CONNECTION ALREADY MADE' message.
   DS xxx $ -
   Opens general purpose relay number 'xxx'.
   If pin was not connected sends 'CONNECTION NEVER MADE' message.
b. CU xxx yyy $ -
   Checks status of I/O pin no. 'xxx' to
   see if it is busy. If it is, sends
   PIN BUSY MSG. If not, checks the
   status of the designated instrument
   no. 'yyy'. If instrument is busy,
   sends INSTRUMENT BUSY MSG. Otherwise,
   it selects the first bus available
   to the I/O Pin and connects I/O Pin
   'xxx' to instrument 'yyy' via that
   bus.
   DU xxx yyy $ -
   Disconnects requested path if it was
   previously made. If it was not previously made with a 'CU' statement,
   sends 'NO PATH MADE' message.
c. CD xxx $ -

-continued

Connects Extended Performance Pin
  'xxx'. Makes no status checks. If
  pin is already connected, sends 'CON-
  NECTION ALREADY MADE' message.
 DD xxx $ -
  Disconnects Extended Performance Pin
  'xxx', if it was connected. Otherwise,
  it sends 'CONNECTION NEVER MADE' MSG.
d. CP xxx $ -
  Makes no status checks. Connects desig-
  nated power supply 'xxx'. If pin is
  already connected, sends 'CONNECTION
  ALREADY MADE' message.
 DP xxx $ -
  Disconnects designated power supply
  'xxx'. If pin was not connected, sends
  'CONNECTION NEVER MADE' message.
e. CB xxx yyy $ -
  Connects designated I/O Pin 'xxx'
  to designated signal bus 'yyy'.
  Makes no status checks.
 DB xxx yyy $ -
  Disconnects I/O Pin 'xxx' from bus
  'yyy'.
f. CI xxx yyy $ -
  Connects designated instrument 'xxx'
  to designated signal bus 'yyy'. Makes
  no status checks. If pin is already
  connected, sends 'CONNECTION ALREADY
  MADE' message.
 DI xxx yyy $ -
  Disconnects instrument 'xxx' from bus
  'yyy'. If pin was not connected sends
  'CONNECTION NEVER MADE' message.
g. R1 xxxx $ -
  Converts number 'xxxx' to a 12 bit
  binary number, and uses that number
  to set output voltage of Reference
  Generator 1.
 R2 xxxx $ -
  Sets output voltage of Reference
  Generator 2.
 R3 xxxx $ -
  Sets output voltage of Reference
  Generator 3.
 R4 xxxx $ -
  Sets output voltage of Reference
  Generator 4.
 R5 xxxx $ -
  Sets output voltage of Reference
  Generator 5.
 R6 xxxx $ -
  Sets output voltage of Reference
  Generator 6.
 R7 xxxx $ -
  Sets output voltage of Reference
  Generator 7.
 R8 xxxx $ -
  Sets output voltage of Reference
  Generator 8.
h. SB xxx $-
  Reads the status of the system bus
  number 'xxx', and returns a three
  digit number specifying the number
  of connections made to that bus.
i. SI xxx $ -
  Reads the status of all relays con-
  nected to the designated instrument
  pin 'xxx' and returns the number of
  all busses to which that pin is con-
  nected
j. SP xxx $ -
  Reads the status of all relays con-
  nected to the designated I/O Pin
  'xxx' and returns the number of all
  busses to which that pin is connected.
k. CL xxx yyy $ -
  Connects a resistive load 'xxx' to
  the designated I/O Pin 'yyy'.
  If the I/O Pin is in use, the load
  will be connected to the I/O Pin via
  the bus to which the I/O Pin is con-
  nected.
  If the I/O Pin in not in use, the load
  will be connected to the I/O Pin via
  the first non-busy bus available to
  the I/O Pin.
  If the I/O Pin has more than one con-
  nection made to it, the message 'I/O
  PIN BUSY' will be returned.
 DL xxx yyy $ -
  Disconnects the designated resistive
  load 'xxx' from the I/O Pin 'yyy'.
  If the load was not connected, 'LOAD
  NEVER CONNECTED' message is returned.
  If the I/O Pin was connected to more
  than one point, only the load will be
  disconnected. Otherwise, both the
  load and the I/O Pin will be discon-
  nected from the bus.
l. LL xxx yyy $ -
  Sets the designated load 'xxx' to
  proper value.
  If yyy = 001, Load = 50Ω
  If yyy ≠ 001, Load = 100Ω
m. CE xxx yyy $ -
  Connect instrument 'xxx' to instru-
  ment 'yyy'. Instrument 'xxx' should
  be the lower numbered instrument in
  the system. Checks the status of
  instrument 'xxx' to see if it is busy,
  then checks the status of instrument
  'yyy'. If either instrument is busy,
  sends 'INSTRUMENT BUSY' message.
  Otherwise, it selects the first bus
  which is not busy and connects both
  instruments to it. If all busses are
  busy, it sends 'NO BUS AVAILABLE'
  message.
 DE xxx yyy $ -
  Disconnects requested path if it
  was previously made. If it was
  not made with a 'CE' statement, it
  sends 'NO PATH MADE' message.
n. CA xxx $ -
  Sets RF attenuator. All segments
  of an RF attenuator up to 110 dB
  are set simultaneously. Makes no
  status checks.

The three I/O Relay cards connect a maximum of 108 Universal I/O Pins, in groups of thirty-six, to the ten line system signal bus. Each of thirty-six Universal I/O Pins are connected from the test interface to the connector (not shown) on the top of the card by a multi-coax cable. Relays selected by latches, and set by the Microprocessor Control card, then connect these pins to the multi-line signal bus.

Each Instrument Relay card connects thirty-six instrument lines to the ten line system signal bus. Each instrument card accepts an input cable of nine instrument lines connected to the connector (not shown) on the top of the card, and as on the I/O Relay card, connects them through relays to the signal bus. In addition, each of the nine instrument input lines is connected through a single relay to three pins on the connector (not shown) on the top of the card, for a total of twenty-seven extended performance paths. The Extended Performance pins are then connected via multi-coax cable in groups of nine to the Extended Performance I/O Pins on the test interface.

Each Instrument Relay card had a termination resistor, programmable to either 50 to 100 ohms. Program and selection of this resistor is under microprocessor control. The resistor termination is treated as a tenth instrument line on each card. It may be connected to any one of the ten signal busses.

Each DAC Relay card contains four D/A Converter (DAC) controlled reference generators. The Microprocessor Control card sends the binary information to an I/O port on the DAC card and then strobes it into the proper 12 bit latch as an input to the D/A Converter in the desired reference generator. The DAC then converts this to a DC voltage. This DC voltage is routed through an output buffer stage to provide 100 mA. drive capability and then on to a pin on the connector (not shown) on the top of the card. From this point, these DC outputs can be treated as any other instrument input line and routed through coax cable to the inputs of an Instrument Relay card. Thus may, with proper switching, be connected to any of the Universal I/O Pins.

Each DAC Relay card also contains 27 general purpose relays connected in form A configuration with both contacts connected to pins on the connector (not shown) on the top of the card. Up to fifty-four pins on the test interface can be connected to these points for user general purpose switching. These relays are selected by the Microprocessor Control card under instructions from the host computer and are connected to the test interface via a multiple coax cable.

Expansion of the system is achieved by insertion of an additional DAC Relay card. The present microprocessor is capable of controlling two DAC Relay cards, which permits selection of up to eight reference generators.

The DC Power Switch card contains eight sets of three relays each for the purpose of allowing system power supplies to be switched under microprocessor control to additional connection points on the test interface. The relays are connected in a double-pole-single-throw configuration to allow switching of floating power supplies.

Figure 3A:
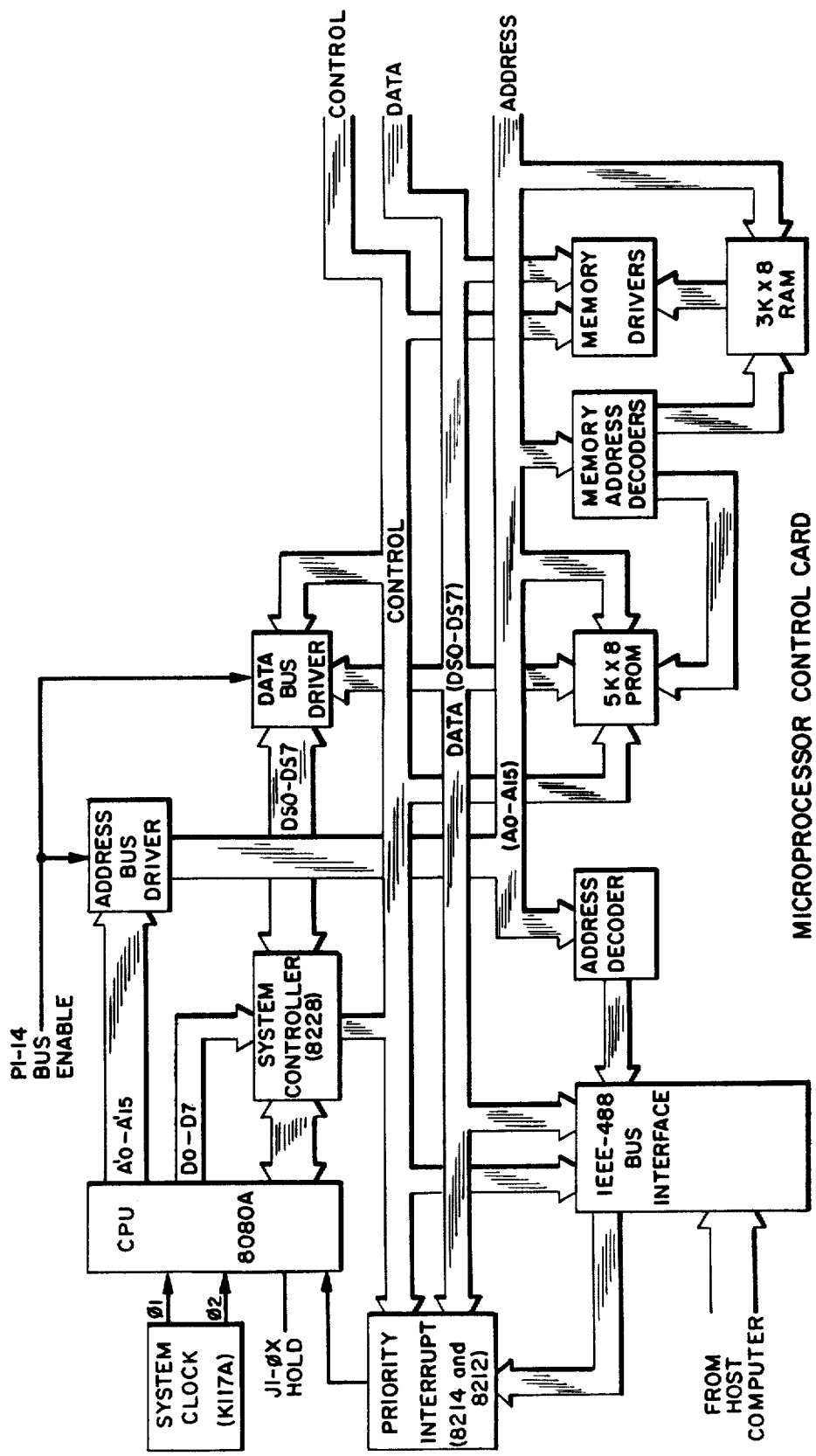
FIG. 3a is a block diagram of the Microprocessor Control card.

Referring to FIG. 3a, a block diagram of the Microprocessor Control card is illustrated. As shown therein, the Microprocessor Control card can be functionally divided into the following four areas: CPU Set; system bus drivers; IEEE-488 interface; and memory circuits.

The CPU Set consists of the Intel 8080A Control Processor, the Intel 8228 System Controller and the Motorola K117A System Clock. The CPU Set performs all system processing functions and provides a stable timing reference for the system circuits. All address and control signals necessary to access system memory and all I/O ports in the system are initiated by the CPU Set. All 78 instructions of the 8080A instruction set can be fetched and executed by the CPU Set. The CPU Set can respond to interrupt requests originating on or off the Microprocessor Control card. In addition, it reponds to wait requests from memory and/or I/O ports, which have an access time slower than the 8080A's cycle time. The CPU also contains (not shown) six 8-bit general purpose registers, an accumulator, a sixteen-bit program counter, a sixteen-bit stack pointer, a sixteen line address bus and an eight line bi-directional data bus. The six general purpose registers may be addressed individually or in pairs to provide both single and double precision operators. The sixteen-bit stack pointer may be used to address a last-in/first-out data storage area located in any part of memory for the temporary storage of the program counter, status flags, accumulator, and any or all general purpose registers to provide almost unlimited nesting of subroutines. The entire instruction set of the 8080A is available for the generation of multiple matrix switching control programs. The accumulator group instructions include arithmetic and logical operations with direct, register indirect, and immediate addressing modes. Move, load, and store instructions allow the movement of data, 8 or 16 bits, between memory, the accumulator and/or any of the general purpose registers, using any of the available addressing modes. Jumps, conditional jumps, and computed jumps, allow branching to various parts of the program. Conditional and unconditional calls and returns from subroutines are included as are single-byte call instructions (Restarts) for interrupt operations. The accumulator, memory, or each of the six general purpose registers may be incremented or decremented. Extended incrementing or decrementing is available for adjusting register pairs and the stack pointer. Arithmetic and interrupt handling capability of the 8080A is extended by the inclusion of double precision operators such as stack manipulation and double add instructions. The 8080A CPU is a dynamic MOS, CPU requiring clock pulses at all times. It operates continually, fetching, decoding, and executing instructions at a rate determined by the Motorola K117A System clock generator. The K117A clock provides stable crystal controlled two-phased timing inputs ($\phi$ and $\phi2$) for the 8080A. It also provides $\phi1$ and $\phi2$ outputs at a TTL level to be used for generating synchronized reset and ready signals for the CPU. 'Ready' and 'Reset' inputs, which are essentially asynchronous inputs, are synchronized to system timing through two 'D' connect flip-flops (not shown) to provide the required inputs to the CPU. All processing activities of the CPU Set are referred to the period of the $\phi1$ and $\phi2$ clock signals. The 8228 System Controller generates all signals required to interface directly the 8080A with system RAM, ROM, and I/O ports. It isolates the 8080A data bus from the system bus. The 8228 generates the correct control signals to allow the use of multiple byte instructions in response to an Interrupt Acknowledge by the 8080A.

Tri-state, high power System Bus Drivers are provided on all address, data and control bus outputs of the CPU Set. Application of a low level signal to the P1-14 Bus Enable line will force all of these drivers to a high impedance state allowing an external device to take over control of the address, data and control busses. A simultaneous level applied to the J1-$\phi$X Hold input line will force the CPU Set to enter the HOLD state.

Figures 3B, 3C:
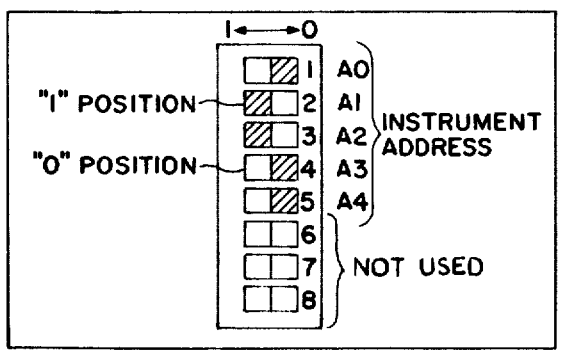
FIG. 3b illustrates the DIP Rocker Switch positions.
FIG. 3c illustrates the DIP Switch codes.

The IEEE-488 Bus Interface GPIB circuitry (not shown) includes two Intel 8255 Programmable Peripheral Interface microcircuits, four Motorola MC3441 GPIB bus interface microcircuits, a Priority Interrupt Chip Set (Intel 8214 and Intel 8212) and other standard flip-flop gates and decoders. The GPIB circuitry provides all the initial high speed handshake signals required on the GPIB. It provides the proper input impedance and necessary drive capability to operate in a GPIB system. The high speed response to command, data, and IFC interrupts, is provided by a Command flip-flop, a Data flip-flop and an IFC flip-flop. Thes flip-flops initially set the GPIB bus interface drivers and receivers to their proper state in response to the attention and IFC signals on the GPIB. They simultaneously generate a proper interrupt to the 8080A through the Priority Interrupt Chip Set. The flip-flops hold the GPIB in the suspended state initially required, until the slower firmware routine is actuated to take over handshake operations on the GPIB. When the firmware take over, the flip-flop is reset enabling it to respond to the next interrupt. One register of the input 8255 is used to sense the switch positions of five DIP Rocker switches. These are compared to incoming addresses on the GPIB to determine if further response is necessary. The five switches are set up as illustrated in FIGS. 3b and 3c at the time of installation in the system.

Memory circuits on the Microprocessor Control card consist of 5K of ROM/PROM and 3K of RAM. The Random Access Memory (RAM) section provides the user with 3072×8 bits of storage area. This is normally used for storage of variable information used during execution of its instructions. It is also used for temporary storage of a self-test procedure used during test of the card.

The Read Only Memory (ROM/PROM) section consists of five Intel 2708 1024×8 bit EPROMS (Erasable Programmable Read-Only-Memory). The first two chips (2048×8) have the IEEE Bus Manager program inserted. There is also a monitor program which allows user interaction with the Microprocessor card through the host computer when testing and troubleshooting. The third and fourth memory I.C.'s contain the multiple matrix switch-op system which enables the Microprocessor Control card to perform the previously discussed instructions. The fifth I.C. memory contains the tables of data required by both the Manager/Monitor programs and the multiple matrix switch-op system programs.

Figure 4:
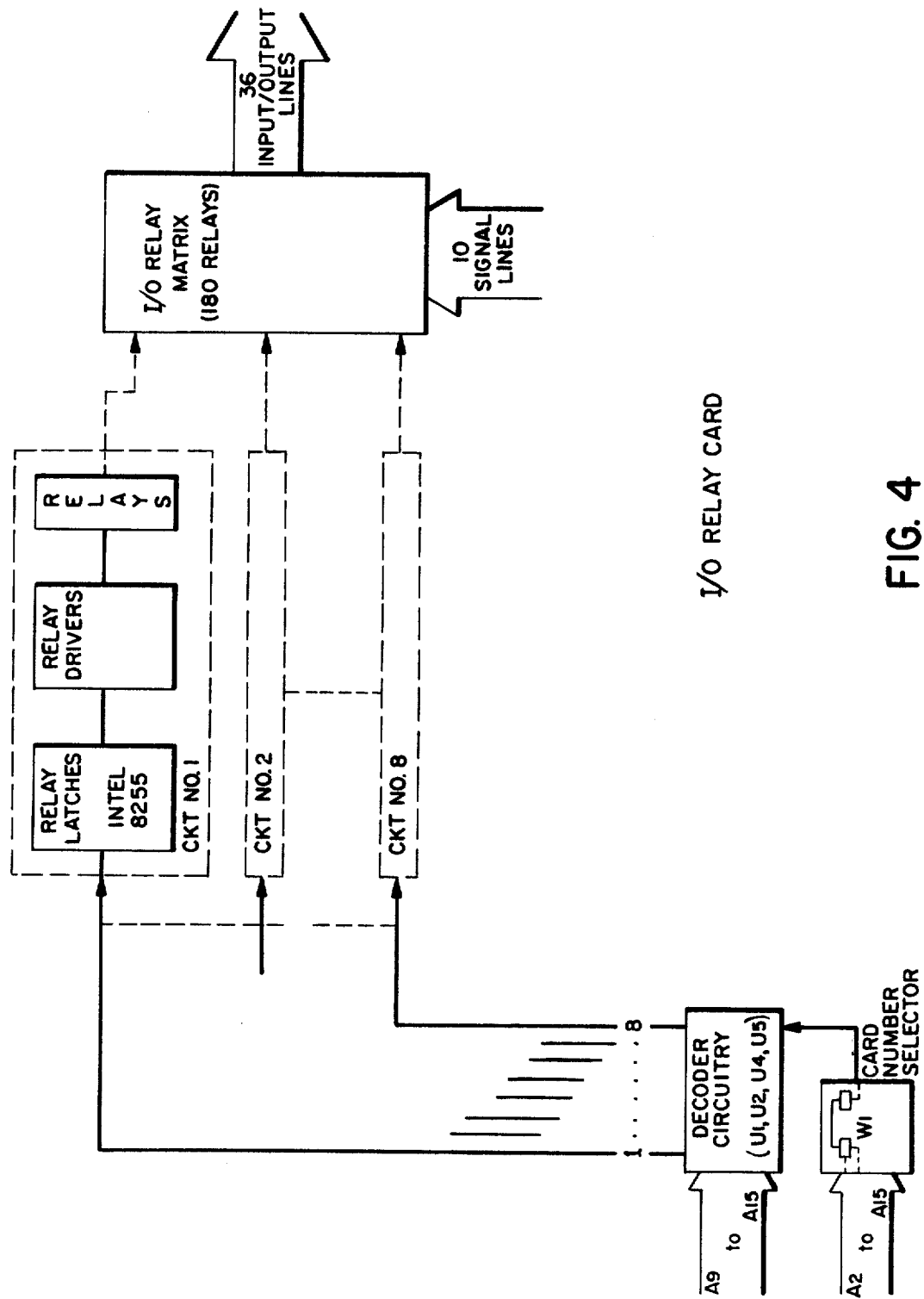
FIG. 4 is a block diagram of the I/O Relay card.

Referring to FIG. 4, a block diagram of the I/O Relay card is illustrated. As shown therein, the I/O Relay card can be functionally divided into the following four sections: Address Decoding; Relay Select I/O Ports; Relay Drivers and Relays; and I/O Signal Paths.

The Address decoding circuitry (not shown) of the I/O Relay card is comprised of U1, U2, U4, and U5. U5 is a binary comparator which senses the state of address lines A9 through A11. When this is a '1' it partially enables U2, an octal decoder which is connected to address lines A12, A13 and A14. U2 requires two other signals to fully enable it. Address line A15 enables gate U1 to allow the output of U4 through to U5. The other enabling input to U5 is the output of U3. W1 is a jumper plug which is used to select address lines $A_2$ through $A_7$. Selection is made based on the card number desired. For example, if there are four I/O Relay cards in the system, the jumper would be used to select Address A2 for card number 1, Address A3 for card number 2, Address A4 for card number 3, and Address A5 for card number 4. The output of the octal decoder U5 is used: (a) to enable the selected Relay I/O Port and (b) to generate an I/O Ready signal for the Microprocessor Control card.

The Relay Select I/O Ports consist of eight Intel 8255 Programmable Peripheral Interface microcircuits. These chips are divided into three 8-bit registers. When the 8255 is programmed as an output each of these registers become 8-bit latches used to hold the desired relay status. When the decoder selects one of the I/O Ports, a microprocessor write pulse will set information on the data bus into that particular register.

Each of the 180 relays on the I/O Relay card is connected to a single bit in one of the 8255 I/O Ports through a relay driver. When the 8255 I/O Port has a '0' (zero) programmed into the register latch, the relay will be grounded through the relay driver, which causes the relay contacts to close.

I/O signal paths are selected by closing the relay contacts, which connect the selected I/O Pin to the desired bus. I/O Pin input wiring and bus wiring are printed circuit lines. Each I/O Pin is connected to five relays and each system signal bus is connected to eighteen relays. The circuits are set so that, while each pin can connect to as many as five busses, no two I/O Pins can be connected to the same set of five busses.

Figure 5:
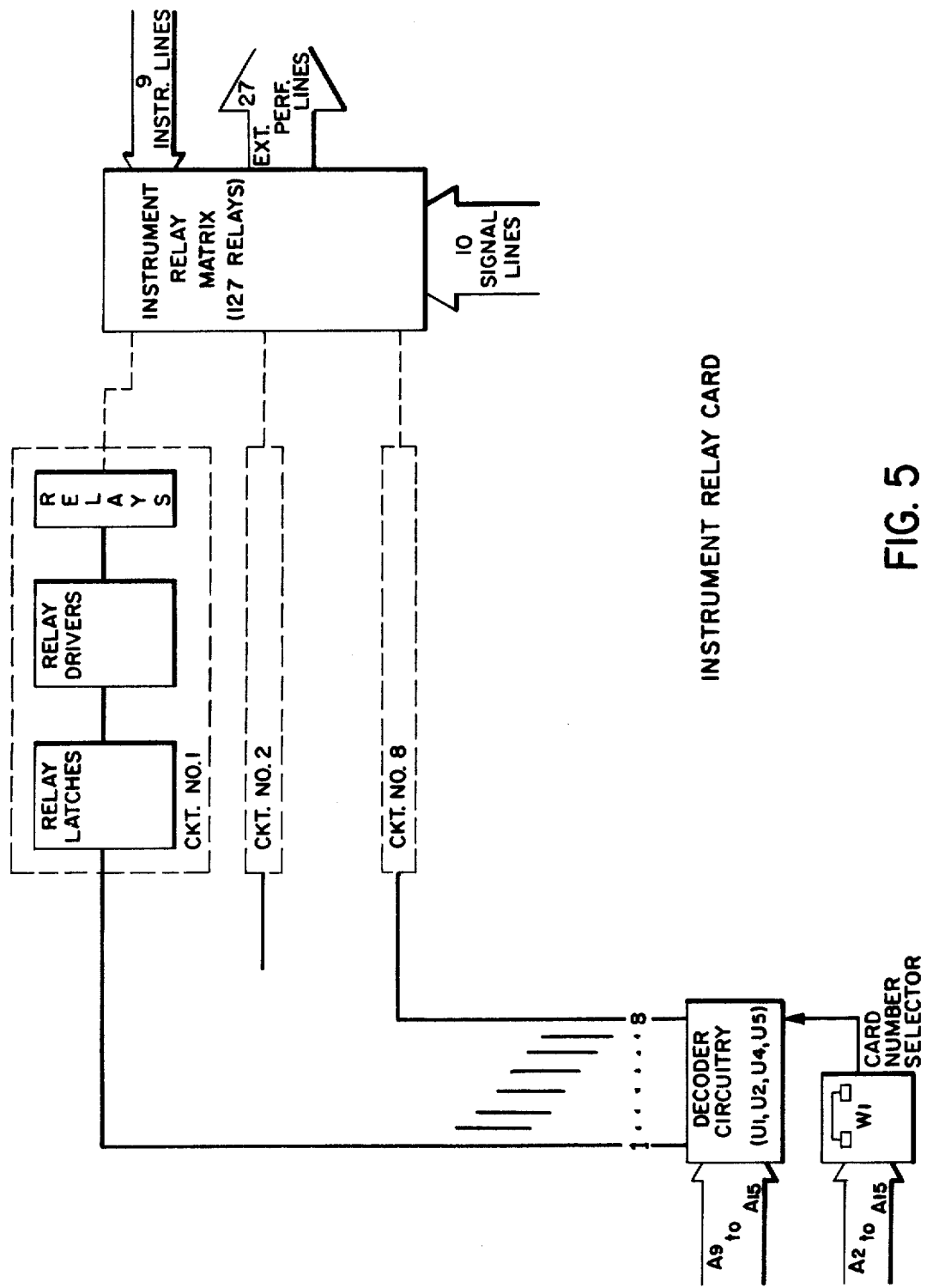
FIG. 5 is a block diagram of the Instrument Relay card.

Referring to FIG. 5, a block diagram of the Instrument Relay card is illustrated. The Instrument Relay card is physically the same as the I/O Relay card with the following exceptions. The decoding circuitry is wired to sense the state of address lines A9 through A11 to be a '2', instead of a '1', as for the I/O Relay card. The Relay driver numbers and locations, and I/O Port numbers and locations are identical to those on the I/O Relay card, but not all numbers are used, since there are only 127 relays instead of 180 relays. The printed circuit signal paths are also different. Each of the 9 input pins can be connected to any one of the 10 signal busses in addition to three extended performance paths.

Figure 6:
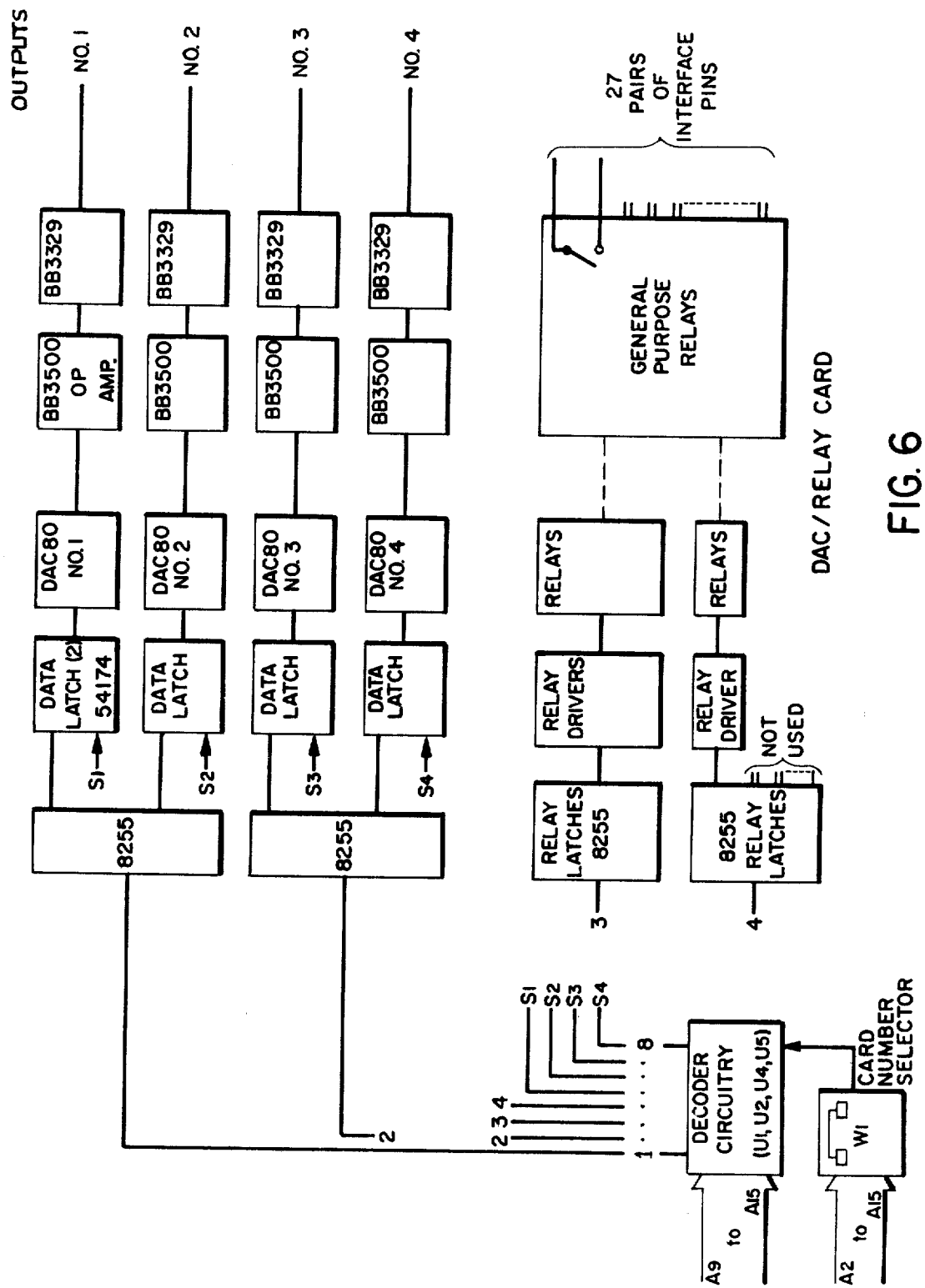
FIG. 6 is a block diagram of the DAC Relay card.

Referring to FIG. 6, a block diagram of the DAC Relay card is illustrated. As shown therein, the DAC/Relay card is divided into two sections: the Relay Section; and the DAC Reference Generator Section.

The Relay Section consists of twenty-seven relays connected in a single-pole single-throw configuration. Both contacts of each relay are brought to the connector (not shown) on top of the card from which they can be connected to the test interface. As on the I/O Relay card, the relays are closed by the setting of a latch in an Intel 8255 Programmable Peripheral Interface IC under control of the Microprocessor Control card. The output latch of the 8255 grounds the relay coil through a relay driver. Status of the relay latches can be read by the microprocessor.

The DAC reference generator section is divided into four identical circuits, each consisting of a Burr Brown DAC 80 D/A Converter and associated input and drive circuitry. The 24 bits of one Intel 8255 are divided into two twelve bit inputs for two DAC 80's. The Microprocessor Control card writes the proper data into Register A and the upper four bits of Register C for the odd numbered Reference Generators (DAC 1 and DAC 3) and into Register B and the lower four bits of Register C for the even numbered Reference Generators (DAC 2 and DAC 4). After writing the 12 bit data into the proper registers the Microprocessor Control card generates a strobe to transfer all 12 bits simultaneously into a 12 bit DAC Input Register consisting of two SN54174 Hex D connect flip-flops. The compliment of the 12-bit word strobed into the DAC Input Register is put on the input of the DAC 80 which converts it to a DC voltage proportional to the magnitude of the binary number. The output of the DAC is applied to a Burr Brown 3500 Op Amp and 3329 Buffer Driver to supply a ±10 V DC output with 100 mA drive capability.

Figure 7:
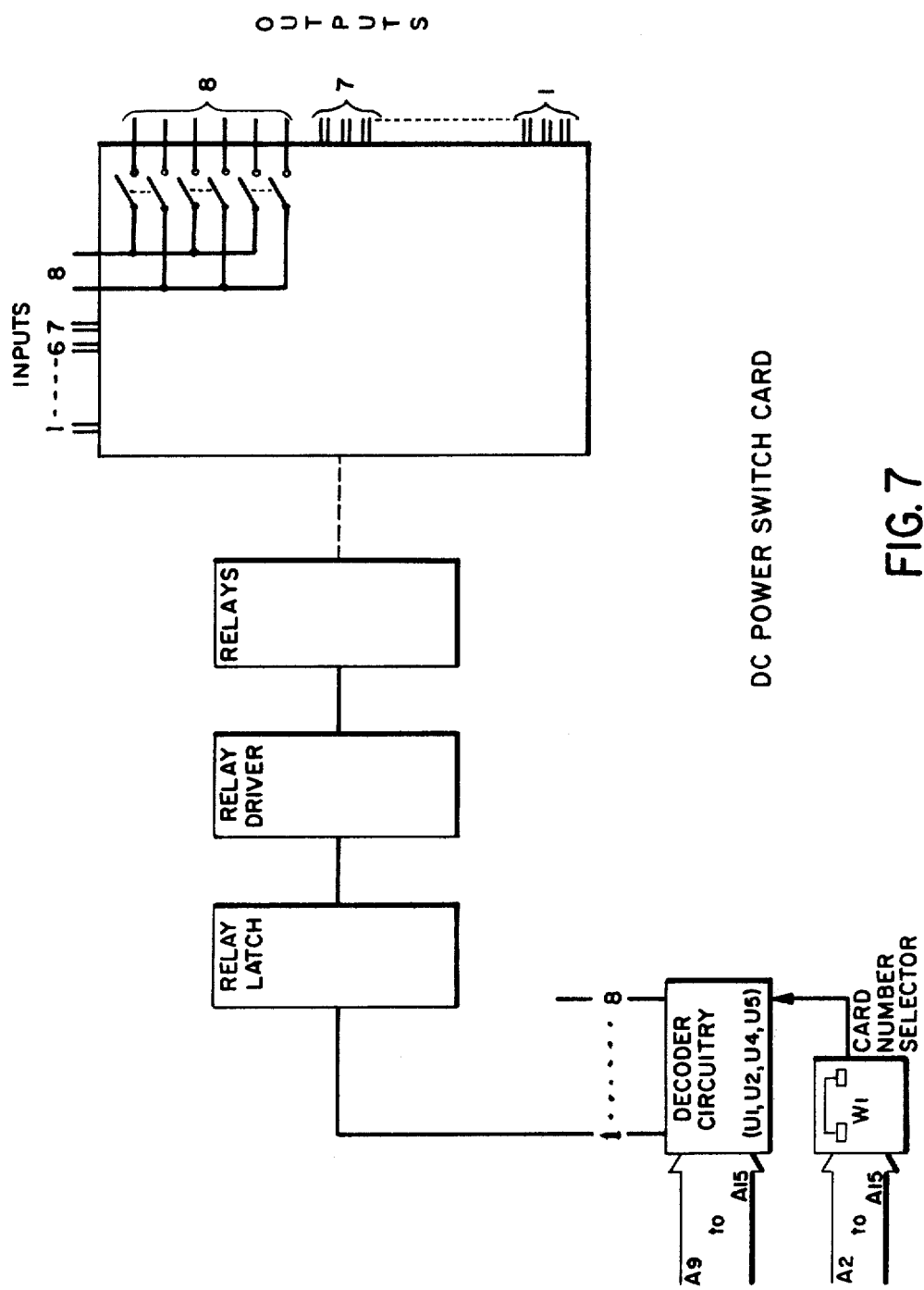
FIG. 7 is a block diagram of the DC Power Switch card.

Referring to FIG. 7, a block diagram of the DC Power Switch card is illustrated. The DC Power Switch card contains twenty-four double-pole, single-throw relays, divided into eight groups of three relays each. In each relay group the common contacts are tied together and brought to a pin on the connector (not shown) on the bottom of the card. The other contacts are connected to the connector (not shown) on the top of the card, from which the relays can be connected to the test interface. The relays are selected by the Microprocessor Control card through an Intel 8255 and relay driver in the same manner as on the I/O Relay and Instrument Relay card.

The above description of the preferred embodiment is exemplary and should not be considered as limiting the scope of the present invention which is defined by the following claims.

What is claimed is:

1. A switching system for selectively connecting a unit under test to an external instrument comprising:
   (a) test interface means for adapting said unit under test to said switching system;
   (b) instrument interface means for adapting said instrument to said switching system;
   (c) signal bus means;
   (d) multiple matrix switching means for controllably providing a signal path between said test interface means and said instrument interface means via said signal bus means;
   (e) control means for selectively activating said multiple matrix switching means to effect connection of said unit under test to said instrument; and
   (f) means for effecting communication between an external controller and said control means.

2. A switching system as recited in claim 1 wherein said multiple matrix switching means include a plurality of relay matrix means; and said control means include microprocessor means.

3. A switching system for selectively connecting a unit under test to an external instrument comprising:
   (a) test interface means for adapting said unit under test to said switching system;
   (b) a plurality of input/output pins connected to said test interface means;
   (c) instrument interface means for adapting said instrument to said switching system;
   (d) a plurality of instrument lines connected to said instrument interface means;
   (e) a multi-line signal bus;
   (f) multiple matrix switching means for controllably providing a signal path between said plurality of input/output pins connected to said test interface means and said plurality of instrument lines connected to said instrument interface means via said signal bus;
   (g) control means for selectively activating said multiple matrix switching means to effect connection of said unit under test to said instrument via said signal bus; and
   (h) bi-directional means for effecting communication between an external controller and said control means.

4. A switching system as recited in claim 3 wherein said multiple matrix switching means include a plurality of relay matrix means; said control means include microprocessor means; and said bi-directional communication means include IEEE-488 compatible interface means.

5. A switching system for selectively connecting a unit under test to an external instrument, and adapted for communication with a host computer comprising:
   (a) test interface means for adapting said unit under test to said switching system;
   (b) a plurality of universal input/output pins connected to said test interface means;
   (c) instrument interface means for adapting said instrument to said switching system;
   (d) a plurality of instrument lines connected to said instrument interface means;
   (e) a multi-line signal bus;
   (f) first switching means for controllably providing a signal path between said plurality of universal input/output pins connected to said test interface means and said signal bus;
   (g) second switching means for controllably providing a signal path between said plurality of instrument lines connected to said instrument interface means and said signal bus;
   (h) control means for selectively activating said first switching means and said second switching means to effect connection of said unit under test to said instrument via said signal bus; and
   (i) bi-directional means for effecting communication between said host computer and said control means.

6. A switching system as recited in claim 5 further including a plurality of high performance pins connected to said test interface means; said second switching means also including means for controllably providing a high performance signal path between said plurality of high performance pins connected to said test interface means and said plurality of instrument lines connected to said instrument interface means; and said control means also including means for selectively activating said second switching means to effect connection of said unit under test to said instrument via said high performance path.

7. A switching system as recited in claim 6 wherein said first switching means include first relay matrix means; said second switching means include second relay matrix means; said control means include microprocessor means; and said bi-directional communication means include IEEE-488 compatible interface means.

8. A switching system for selectively connecting a unit under test to an external instrument, and adapted for communication with a host computer comprising:
   (a) test interface means for adapting said unit under test to said switching system;
   (b) a plurality of universal input/output pins connected to said test interface means;
   (c) a plurality of high performance pins connected to said test interface means;
   (d) a plurality of direct current power pins connected to said test interface means;
   (e) instrument interface means for adapting said instrument to said switching system;
   (f) a plurality of instrument lines connected to said instrument interface means;
   (g) a plurality of direct current power supply lines connected to said instrument interface means;
   (h) a multi-line signal bus;
   (i) first switching means for controllably providing a signal path between said plurality of universal input/output pins connected to said test interface means and said signal bus;
   (j) second switching means for controllably providing a signal path between said plurality of instrument lines connected to said instrument interface means and said signal bus; said second switching means also including means for controllably providing a high performance signal path between said plurality of high performance pins connected to said interface means and said plurality of instrument lines connected to said instrument interface means;
   (k) third switching means for controllably providing a high current signal path between said plurality of direct current power pins connected to said test interface means and said plurality of direct current power supply lines connected to said instrument interface means;

(l) control means for selectively activating said first switching means and said second switching means to effect connection of said unit under test to said instrument via said signal bus; said control means also including means for selectively activating said second switching means to effect connection of said unit under test to said instrument via said high performance path and means for selectively activating said third switching means to effect connection of said unit under test to said instrument via said high current path; and (m) bi-directional means for effecting communication between said host computer and said control means.

9. A switching system as recited in claim 8 wherein said first switching means include first relay matrix means; said second switching means include second relay matrix means; said third switching means include a plurality of multiple relay means; said control means include microprocessor means; and said bi-directional communication means include IEEE-488 compatible interface means.

10. A switching system for selectively connecting a unit under test to an external instrument, and adapted for communication with a host computer comprising:

(a) test interface means for adapting said unit under test to said switching system;

(b) a plurality of universal input/output pins connected to said test interface means;

(c) a plurality of high performance pins connected to said test interface means;

(d) a plurality of direct current power pins connected to said test interface means;

(e) a plurality of general purpose pins connected to said interface means;

(f) instrument interface means for adapting said instrument to said switching system;

(g) a plurality of instrument lines connected to said instrument interface means;

(h) a plurality of direct current power supply lines connected to said instrument interface means;

(i) a plurality of reference generator output lines connected to said instrument interface means;

(j) a multi-line signal bus;

(k) a plurality of programmable reference generators;

(l) a plurality of general purpose relays;

(m) first switching means for controllably providing a signal path between said plurality of universal input/output pins connected to said test interface means and said signal bus;

(n) second switching means for controllably providing a signal path between said plurality of instrument lines connected to said instrument interface means and said signal bus; said second switching means also including means for controllably providing a high performance signal path between said plurality of high performance pins connected to said test interface means and said plurality of instrument lines connected to said instrument interface means;

(o) third switching means for controllably providing a high current signal path between said plurality of direct current power pins connected to said test interface means and said plurality of direct current power supply lines connected to said instrument interface means;

(p) fourth switching means for controllably providing a reference generator signal path between said plurality of reference generators and said plurality of reference generator output lines connected to said instrument interface means; said fourth switching means also including means for controllably providing a general purpose signal path between said plurality of general purpose pins connected to said test interface means and said plurality of general purpose relays;

(q) control means for selectively activating said first switching means and said second switching means to effect connection of said unit under test to said instrument via said signal bus; said control means also including means for selectively activating said second switching means to effect connection of said unit under test to said instrument via said high performance path and means for selectively activating said third switching means to effect connection of said unit under test to said instrument via said high current path; said control means further including means for selectively activating said fourth switching means to effect connection of said plurality of reference generators to said instrument interface means via said reference generator signal path and to effect connection of said plurality of general purpose relays to said test interface means via said general purpose signal path; and (r) bi-directional means for effecting communication between said host computer and said control means.

11. A switching system as recited in claim 10 wherein said first switching means include first relay matrix means; said second switching means include second relay matrix means; said third switching means include a plurality of multiple relay means; said control means include microprocessor means; and said bi-directional communication means include IEEE-488 compatible interface means.

* * * * *